United States Patent [19]
Terayama

[11] Patent Number: 5,978,949
[45] Date of Patent: Nov. 2, 1999

[54] FAILURE ANALYSIS DEVICE FOR IC TESTER AND MEMORY DEVICE MEASURING DEVICE FOR IC TESTER

[75] Inventor: Chitomi Terayama, Tokyo, Japan

[73] Assignee: Ando Electric Co., Ltd., Tokyo, Japan

[21] Appl. No.: 09/059,282

[22] Filed: Apr. 14, 1998

[30] Foreign Application Priority Data

Apr. 14, 1997 [JP] Japan ................................. 9-095903

[51] Int. Cl.⁶ .............................. G01R 31/28; G11C 7/00
[52] U.S. Cl. ........................................... 714/738; 365/201
[58] Field of Search ................................... 714/718, 711, 714/723, 733, 738, 719, 743; 365/201

[56] References Cited

U.S. PATENT DOCUMENTS

| | | | |
|---|---|---|---|
| 4,414,665 | 11/1983 | Kimura et al. .......................... | 714/718 |
| 4,862,460 | 8/1989 | Yamaguchi .............................. | 714/738 |
| 5,018,145 | 5/1991 | Kikuchi et al. ......................... | 714/738 |
| 5,383,195 | 1/1995 | Spence et al. .......................... | 714/733 |
| 5,410,687 | 4/1995 | Fujisaki et al. ...................... | 714/711 X |
| 5,432,797 | 7/1995 | Takano .................................... | 714/738 |
| 5,539,699 | 7/1996 | Sato et al. .............................. | 365/201 |
| 5,831,989 | 11/1998 | Fujisaki .................................. | 714/723 |
| 5,835,428 | 11/1998 | Kobayashi .............................. | 365/201 |
| 5,841,785 | 11/1998 | Suzuki .................................... | 714/718 |

*Primary Examiner*—Hoa T. Nguyen
*Attorney, Agent, or Firm*—Pillsbury Madison & Sutro LLP

[57] ABSTRACT

A failure analysis device of the present invention performs a simple and quick failure analysis of a memory device. The failure analysis device for an IC tester analyzes failure data received from a memory device and comprises a memory and a selector. The memory stores the failure data. The selector optionally selects an address to which the failure data is written. The selectors connect the address with an address of the memory and output the failure data to the memory.

13 Claims, 6 Drawing Sheets

: AREA IN WHICH FAILURE DATA IS STORED

FIG.5

: MEMORY AREA OF 1 BIT OF X:000 AND Y:000

FAILURE ANALYSIS DEVICE FOR IC TESTER AND MEMORY DEVICE MEASURING DEVICE FOR IC TESTER

BACKGROUND OF THE INVENTION

1. Field of the Invention

The present invention relates to a failure analysis device and a memory device measuring device for an IC tester. In particular, the present invention reduces the memory capacity of an internal memory in the failure analysis device and performs an address translation for the stored failure data of the internal memory regardless of an increase in memory capacity of the memory device and complication of an address decoder circuit.

2. Description of Related Art

Figure 6:
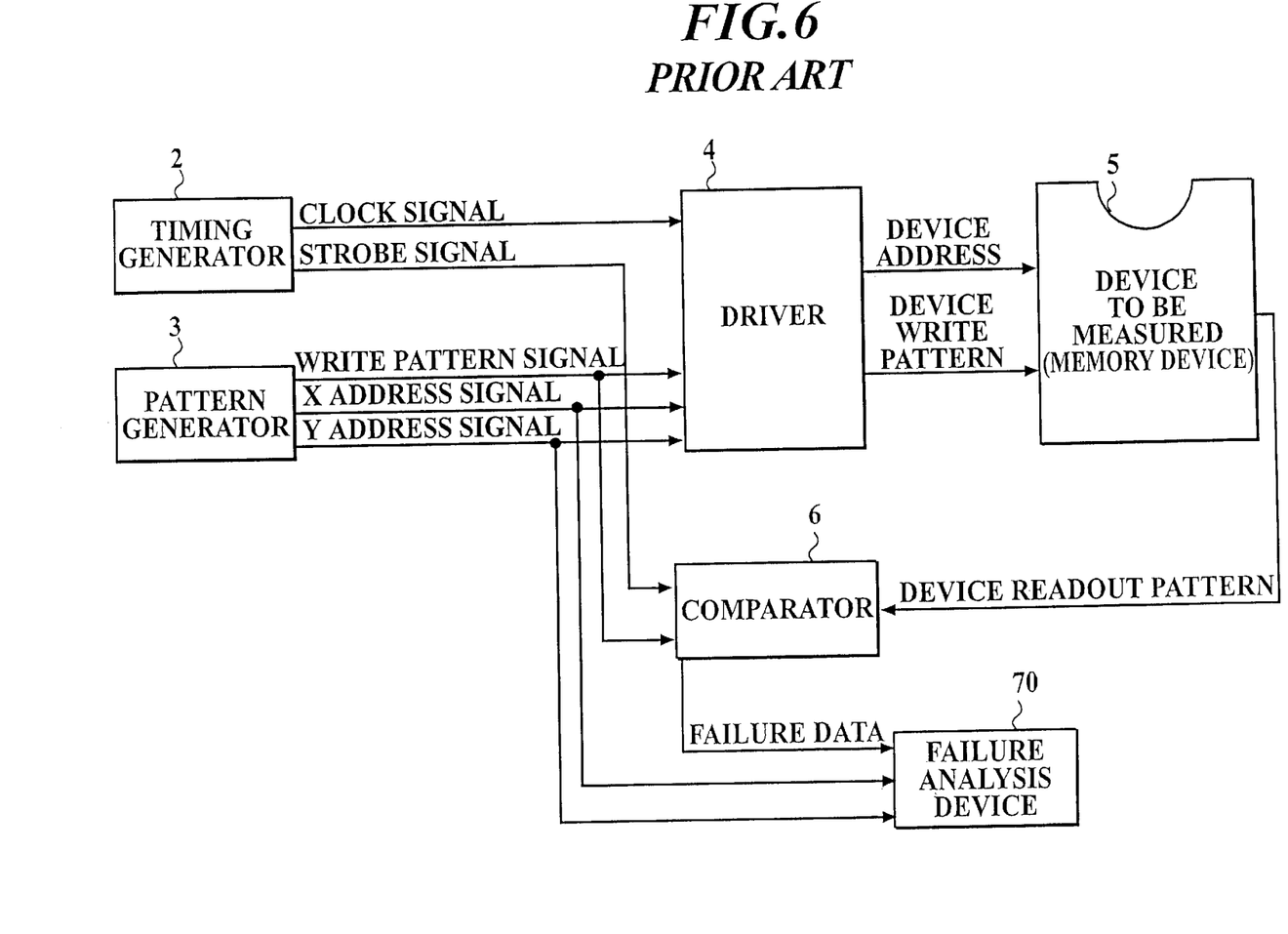
FIG. 6 is a block diagram showing the composition of a conventional memory device measuring device for an IC tester.

A memory device measuring device for an IC tester shown in FIG. 6 is known as a conventional device.

The memory device measuring device shown in FIG. 6 comprises a timing generator 2, a pattern generator 3, a driver 4, a device 5 to be measured, a comparator 6, a failure analysis device 70, and the like.

The timing generator 2 outputs a clock signal to the driver 4 and outputs a strobe signal to the comparator 6. The pattern generator 3 outputs a write pattern signal to the driver 4 and the comparator 6, and outputs X and Y address signals to the driver 4 and the failure analysis device 70.

The driver 4 outputs a device address to the device 5 to be measured and writes the device write pattern corresponding to the device address to the device 5 on the basis of the clock signal received from the timing generator 2, the write pattern signal received from the pattern generator 3 and the X and Y address signals received from the pattern generator 3.

The comparator 6 compares the write pattern signal received from the pattern generator 3 as an expected pattern with device readout pattern received from the device 5 to be measured, on the basis of the strobe signal received from the timing generator 2. When one pattern does not coincide with the other, the comparator 6 outputs a failure data to the failure analysis device 70.

The failure analysis device 70 stores the failure data received from the comparator 6 in the internal memory 7D thereof corresponding to the address assigned by the X and Y address signals received from the pattern generator 3.

Figure 7:
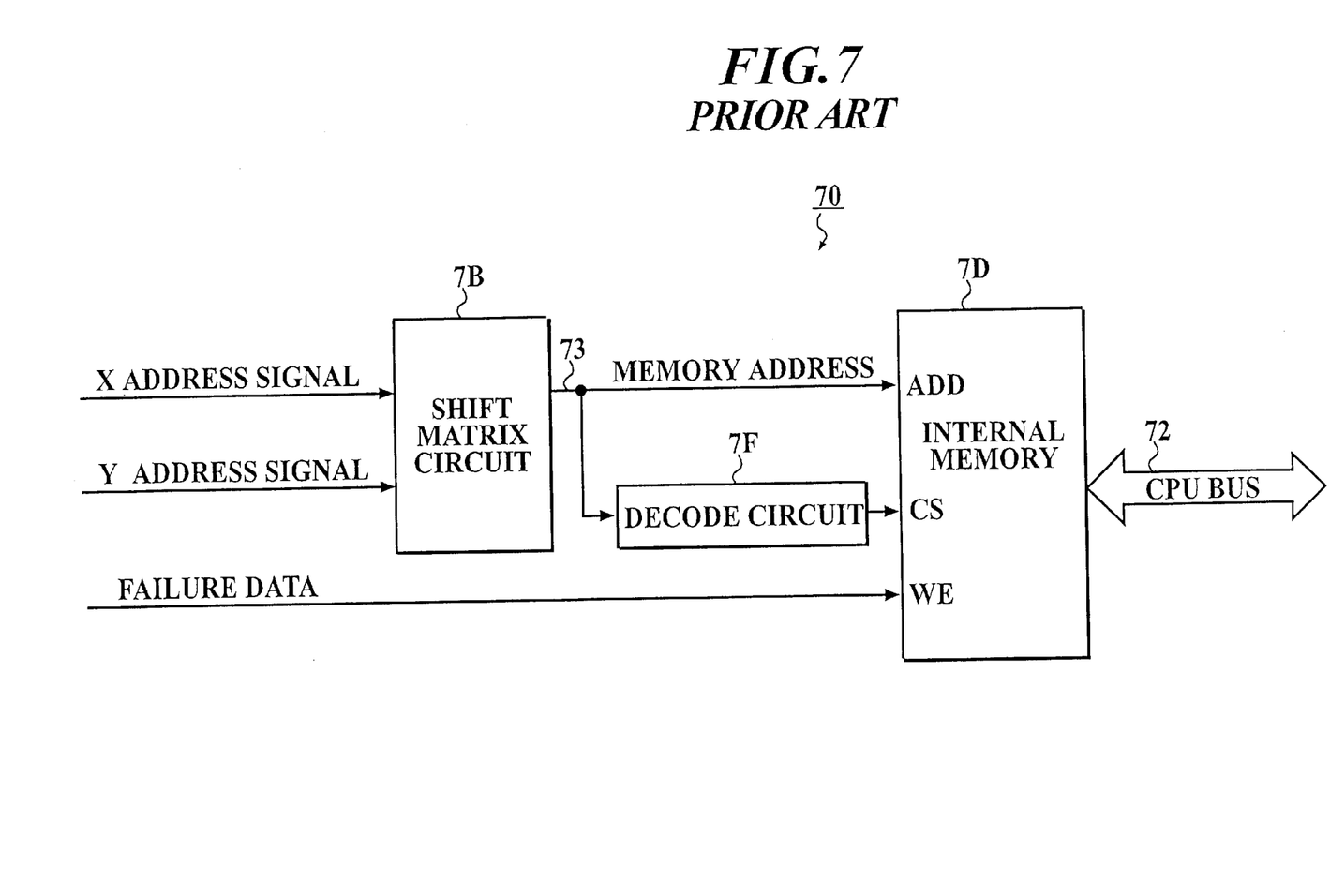
FIG. 7 is a block diagram showing the composition of a conventional failure analysis device.

FIG. 7 is a block diagram showing a concrete composition of the above-mentioned failure analysis device.

The failure analysis device 70 shown in FIG. 7 comprises an n-bit shift matrix circuit 7B, an internal circuit 7D, a decode circuit 7F to increase the memory capacity of the internal memory 7D, and the like. Further, reference numeral 73 designates a memory address (line) of the internal memory 7D which is connected with a CPU (not shown) through a CPU bus 72.

The n-bit shift matrix circuit 7B outputs the X and Y address received from the pattern generator 3 shown in FIG. 6 as the memory address 73 obtained by shifting the Y address for the number of the effective bits of the X address and by incorporating one address into the other, and stores the failure data received from the comparator 6 in the internal memory 7D by using a write enable terminal (WE) of the internal memory 7D when the failure data is detected. The CPU (not shown) fetches the failure data stored in the internal memory 7D through the CPU bus 72 in order to carry out the failure analysis.

However, according to the composition of the failure analysis device shown in FIG. 7, there is a problem that when the device address space of the device 5 to be measured is larger than the memory address space of the internal memory 7D, the failure analysis device 70 fetches the failure data into the internal memory 7D thereof and analyzes the data several times.

Further, when the bits used for the X and Y address of the device 5 to be measured are not consecutive, the area of the internal memory 7D, in which the failure data is stored is divided into several sections. Therefore, there is a problem that when the failure data of the internal memory 7D is fetched to the CPU, it takes longer to read all of the memory space of the internal memory 7D.

SUMMARY OF THE INVENTION

The present invention was developed in view of the above-described problems.

An object of the present invention is to provide a failure analysis device for and a memory device measuring device for an IC tester which can reduce the memory capacity of an internal memory in the failure analysis device and can change an address of the internal memory, to which a failure data is stored, so that the simple and quick failure analysis of the memory device can be performed.

That is, in accordance with one aspect of the present invention, the failure analysis device for an IC tester, which is in a memory device measuring device, writes a write pattern to a memory device, compares the write pattern written to the memory device with a write pattern which is not written to the memory device every address, detects that the write pattern written to the memory device does not coincide with the write pattern which is not written to the memory device as a failure data of the memory device and analyzes the failure data. The failure analysis device includes an internal memory for storing the failure data into a memory address to be assigned and a selector which optionally selects X and Y address that assigns the memory address outputted from a pattern generator and connects the X and Y address with the memory address of the internal memory.

According to the failure analysis device for the IC tester, the selector can select the received X and Y address optionally and can connect the X and Y address with the memory address of the internal memory. As a result, the X and Y address can be selected and can be connected with the memory address of the internal memory according to the device address space of the device memory and the condition of the internal memory, so that the simple and quick failure analysis of the memory device can be performed. Further, the memory capacity of the internal memory can be reduced.

The selector may close up bits of a device address, which are not used by the memory device, select the X and Y address and connect the X and Y address with the memory address of the internal memory.

The selector may select the X and Y address so that the memory address of the internal memory may be consecutive when the X and Y addresses received from the pattern generator are not consecutive, and may connect the X and Y address with the memory address of the internal memory.

Further, when an address space of the memory device is larger than that of the internal memory, the selector may select the X and Y address received from the pattern generator after part of the X and Y addresses are removed, and may connect the X and Y address with the memory address of the internal memory. An OR data of the failure data written to a plurality of addresses of the memory device may be written to an optional bit of the internal memory.

In accordance with another aspect of the present invention, the memory device measuring device for an IC tester, performs a failure analysis of a memory device and comprises a timing signal generating circuit; a strobe signal, a pattern signal generating circuit, a driver, the memory device, the comparator, a selector, and the internal memory. A timing signal generating circuit generates a clock signal. The pattern signal generating circuit generates a write pattern, and X and Y address. The driver fetches the X and Y address that are received from the timing signal generating circuit and the write pattern that corresponds to the X and Y address on the basis of the clock signal received from the timing signal generating circuit, for selecting a device address of the memory device and for outputting a device write pattern corresponding to the X and Y address. The memory device stores the device write pattern the device address selected by the driver. The device write pattern is read out as a device readout pattern by a comparator. The comparator compares the write pattern with the device readout pattern read out from the memory device every address on the basis of the strobe signal received from the pattern generating circuit and for outputting a failure data when the write pattern is not coincident with the device readout pattern. The selector optionally selects the X and Y address received from the pattern signal generating circuit and connects the X and Y address with a memory address of an internal memory. The internal memory stores the failure data received from the comparator to the memory address assigned by the selector.

According to the memory device measuring device for the IC tester, the selector can select the received X and Y address optionally and can connect the X and Y address with the memory address of the internal memory. As a result, the X and Y address can be selected and can be connected with the memory address of the internal memory according to the device address space of the device memory and the condition of the internal memory, so that the simple and quick failure analysis of the memory device can be performed.

BRIEF DESCRIPTION OF THE DRAWINGS

The present invention can be fully understood from the detailed description given hereinbelow and the accompanying drawings which are given by way of illustration and thus do not limit the present invention.

DESCRIPTION OF THE PREFERRED EMBODIMENT

A preferred embodiment of the present invention will be described with reference to the drawings.

Figure 1:
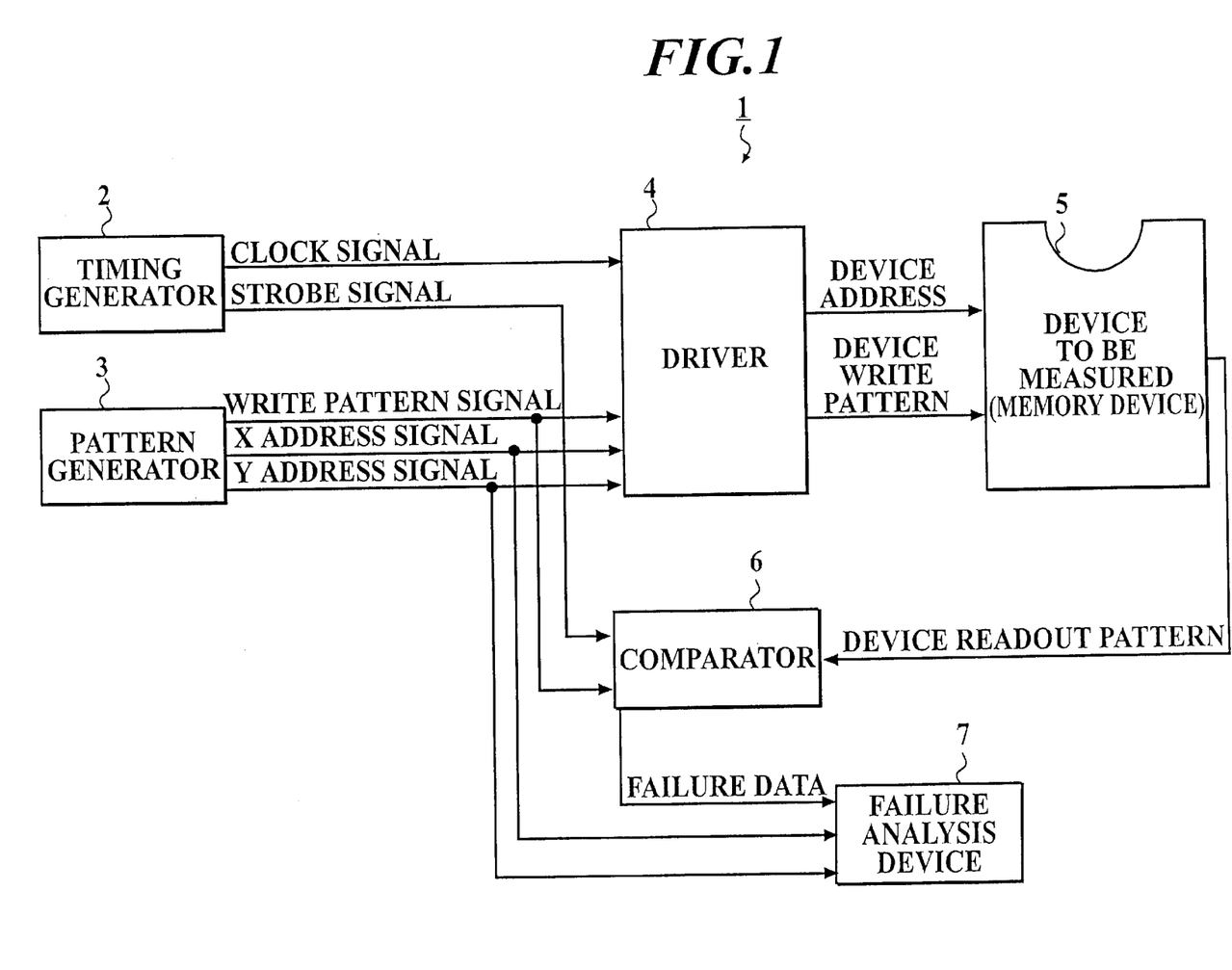
FIG. 1 is a block diagram showing the composition of a memory device measuring device for an IC tester according to the present invention.

FIG. 1 is a block diagram showing the composition of a memory device measuring device for an IC tester according to the present invention. In FIG. 1, elements and parts which are equivalent in function to those of FIG. 6 are designated by identical reference numerals.

A memory device measuring device 1 shown in FIG. 1 comprises a timing generator 2, a pattern generator 3, a driver 4, a device 5 to be measured, a comparator 6, a failure analysis device 7, and the like.

The timing generator 2 outputs a clock signal to the driver 4, and outputs a strobe signal to the comparator 6.

The pattern generator 3 outputs a write pattern signal to the driver 4 and the comparator 6, and outputs X and Y address signals to the driver 4 and the failure analysis device 7.

The driver 4 fetches the X and Y address signals and the write pattern signal received from the pattern generator 3 in synchronization with the clock signal received from the timing generator 2. Thereafter, the driver 4 selects a device address of the device 5 to be measured on the basis of the fetched the X and Y address signals. The driver 4 writes the write pattern corresponding to the device address to the device 5 to be measured.

The device 5 to be measured (memory device) comprises, for example, a DRAM and the like. The device write pattern corresponding to the device address assigned by the driver 4 is written to the device 5 to be measured. Further, a device readout pattern outputted from the device 5 to be measured is read out by the comparator 6.

The comparator 6 compares the write pattern received from the pattern generator 3 as an expected pattern with the device readout pattern read out from the device 5 to be measured every address on the basis of the strobe signal received from timing generator 2. Further, when the expected pattern does not coincide with the device readout pattern, the comparator 6 outputs the failure data to the failure analysis device 7. That is, the comparator 6 judges whether the write pattern outputted from the pattern generator 3 is normally written to the device 5 to be measured or not.

The failure analysis device 7 selects the memory address of the internal memory 7D on the basis of the X and Y address signals received from the pattern generator 3, and then stores the failure data received from the comparator 6 into the address corresponding to the X and Y address signals.

Figure 2:
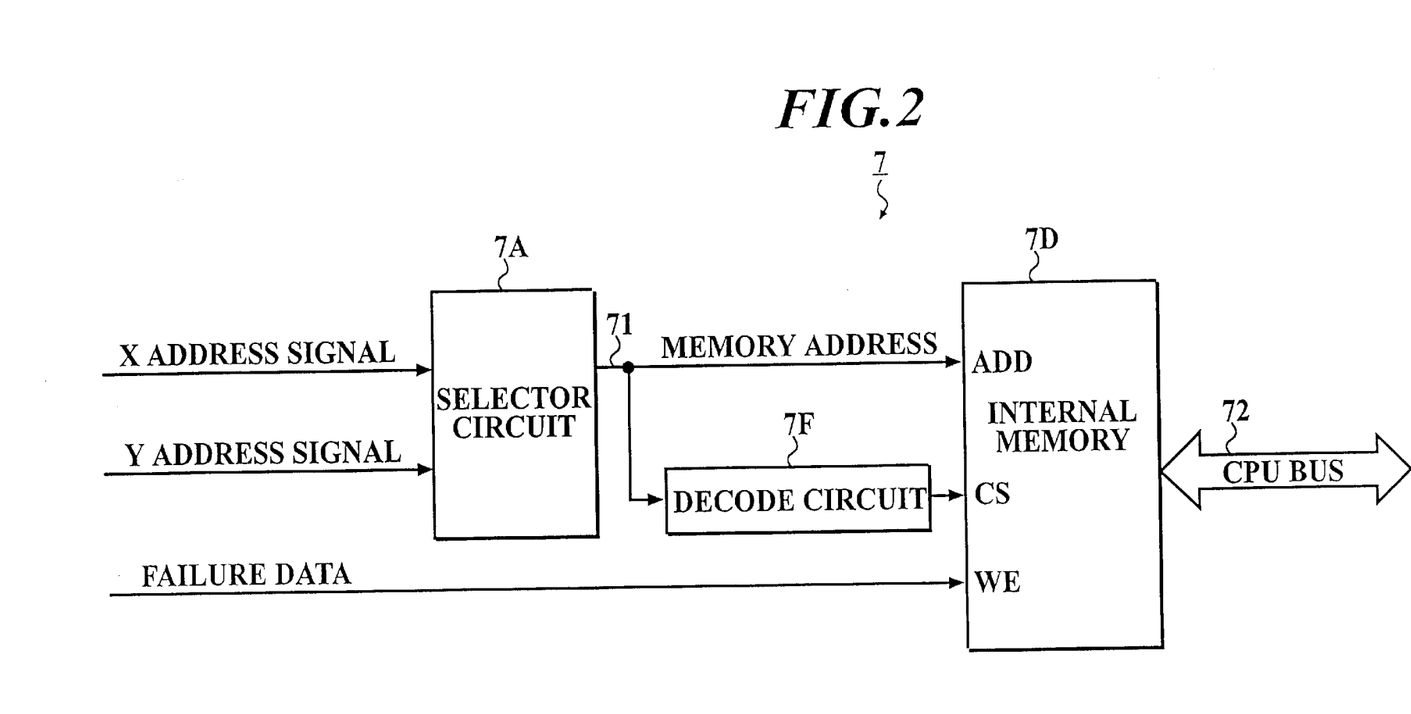
FIG. 2 is a block diagram showing the concrete composition of a failure analysis device in the memory device measuring device shown in FIG. 1.

FIG. 2 is a block diagram showing the concrete composition of the above-mentioned failure analysis device 7. In FIG. 2, elements and parts which are equivalent in function to those of FIG. 6 are designated by identical reference numerals.

The failure analysis device 7 shown in FIG. 2 comprises a selector circuit 7A, a decode circuit 7F, a memory 7D and the like. Further, reference numeral 71 designates a memory address (line) of the internal memory 7D which is connected with a CPU (not shown) through a CPU bus 72.

The selector circuit 7A outputs n bits data which are based on the X and Y address signals received from the pattern generator 3. That is, the selector circuit 7 is connected with the memory address 71 of the internal memory 7D on the basis of the X and Y address signals received from the pattern generator 3.

The selector circuit 7A closes up bits of a device address, which are not used by the device 5 to be measured. Thereafter, the selector circuit 7A selects the X and Y address received from the pattern generator 3 and connects the X and Y address with the memory address 71 of the internal memory 7D.

Further, for example, when the X and Y addresses received from the pattern generator 3 are not consecutive, in order to prevent the area of the internal memory 7D, in which data is stored, from being divided into several sections, the selector circuit 7A selects the X and Y address so that the memory address 71 of the internal memory 7D may be consecutive. Thereafter, the selector circuit 7A connects the X and Y address with the memory address 71 of the internal memory 7D.

Further, for example, when the address space of the device 5 to be measured is larger than that of the internal memory 7D, the selector circuit 7A selects the X and Y address received from the pattern generator 3 after part of the X and Y addresses are removed. Then the selector circuit 7A connects the X and Y address with the memory address of the internal memory 7D. The OR data of the removed failure data written to several addresses of the device 5 is stored to one address of the internal memory 7D, so that all of the failure data of the device 5 to be measured can be written to the internal memory 7D by one writing operation.

The decode circuit 7F generates a chip select (CS) signal in order to select the memory, and outputs the generated chip select to a CS terminal of the internal memory 7D on the basis of the memory address of the internal memory 7D, which is selected by the selector circuit 7A.

The internal memory 7D stores the failure data received from the comparator 6 into the address of the memory address 71 selected (connected with the X and Y address) by the selector circuit 7A. The failure data stored in the internal memory 7D is fetched to the CPU through the CPU bus 72, and then the failure analysis is carried out.

Next, the operation of the failure analysis device 7 shown in FIG. 2 will be described with reference to FIGS. 3 to 5.

FIG. 3A to 3D are views showing examples of area in which the failure data is stored in the internal memory 7D, in a conventional failure analysis device shown in FIG. 7

For example, assuming that the number of bits used for the memory address 71 of the internal memory 7D is 22 bits, and that the device 5 to be measured uses the bits X0 to X11 and X13 as the X address and uses the bits Y0 to Y7 and Y9 as the Y address. That is, the pattern generator 3 does not use the bits X12 and Y8.

In this case, the address space of the device 5 to be measured is of 22 bits. However, in the conventional failure analysis device shown in FIG. 7, when the X and Y address signals are received from the pattern generator 3, a shift matrix circuit 7B must have an address space of 24 bits (address space to which 14 bits of X0 to X13 and 10 bits of Y0 to Y9 are added). As a result, the failure data written in all of the space of the device 5 to be measured cannot be stored into the internal memory 7D without dividing the failure data into four parts, as shown in FIGS. 3A to 3D. Here, FIGS. 3A, 3B, 3C and 3D show examples of the area in which a failure data is stored in the internal memory 7D at the first time, the second time, the third time and the fourth time, respectively.

On the contrary, in the failure analysis device according to the present invention shown in FIG. 2, when the X and Y address signals are received from the pattern generator 3, the selector circuit 7D closes up the bits (X12, Y8) which are not used by the device 5 to be measured in the address space of 24 bits, selects the X and Y address signals and then connects the selected X and Y address with the address line of the internal memory 7D, so that the space of the X address becomes of 12 bits of X0 to X11 and X13, and the space of the Y address becomes of 10 bits of Y0 to Y7 and Y9, that is, the total space becomes of 22 bits. Therefore, because the space of the X and Y address is not larger than that of the device address 71 (22 bits) of the internal memory 7D, the failure data written in all of the space of the device 5 to be measured can be stored in the internal memory 7D by only one writing operation.

Figure 4:
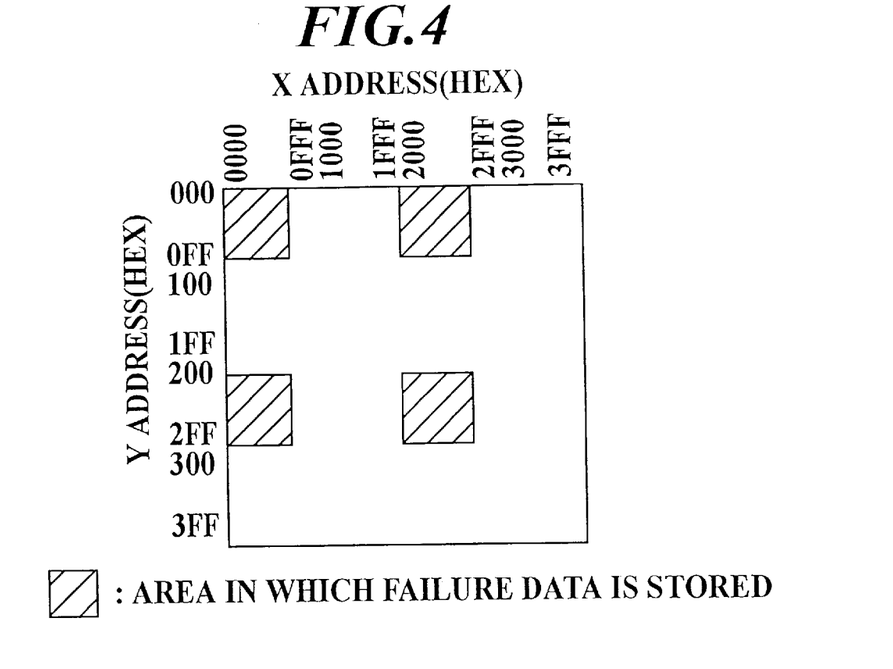
FIG. 4 is a view showing that area in which the failure data is stored in the internal memory is divided into several sections.

FIG. 4 is a view showing area in which the failure data is stored in the internal memory 7D is divided into several sections.

Figures 3A, 3B:
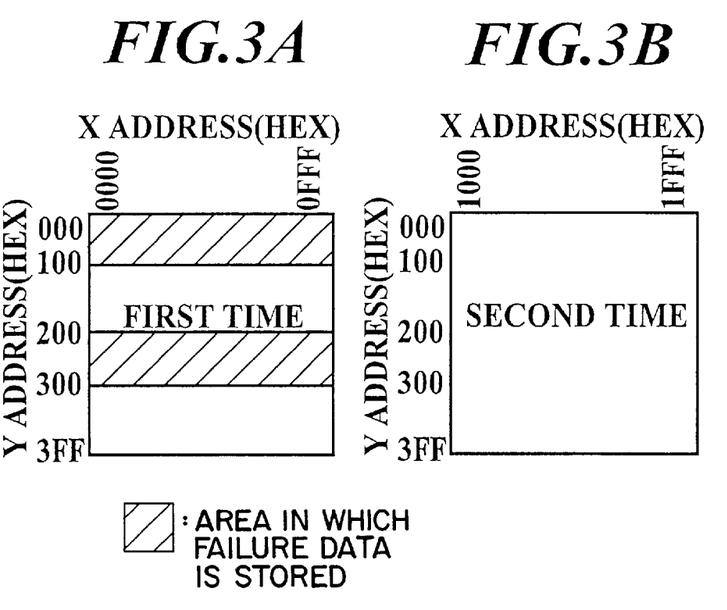
FIG. 3A is a view showing an example of area in which the failure data is stored in the internal memory at the first time, in a conventional failure analysis device shown in FIG. 7.
FIG. 3B is a view showing an example of area in which the failure data is stored in the internal memory at the second time, in a conventional failure analysis device shown in FIG. 7.
Figures 3C, 3D:
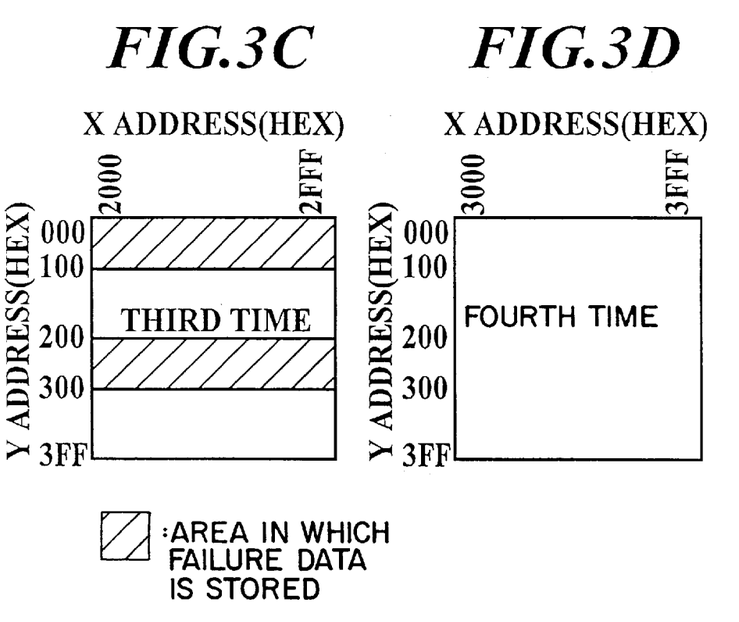
FIG. 3C is a view showing an example of area in which a failure data is stored in the internal memory at the third time, in a conventional failure analysis device shown in FIG. 7.
FIG. 3D is a view showing an example of area in which a failure data is stored in the internal memory at the fourth time, in a conventional failure analysis device shown in FIG. 7.

In FIG. 3, it was explained above how the failure analysis device 7 was operated in the case that the internal memory 7D could not store the failure data at once. However, even if the failure data can be stored at once, in the case that the bits used for the X and Y address of the internal memory 7D are not consecutive, the area in which the failure data is stored is divided into several sections as shown in FIG. 4.

In the failure analysis device according to the present embodiment shown in FIG. 2, when the X and Y address signals received from the pattern generator 3 are not consecutive, the select circuit 7A selects the X and Y address (connects the X and Y address with the memory address of the internal memory 7D) so that the address of the internal address 7D may be consecutive, e.g., the bits in which the failure data is not stored may be closed up. As a result, the area in which the failure data is stored in the internal memory 7D is not divided into several sections.

Figure 5:
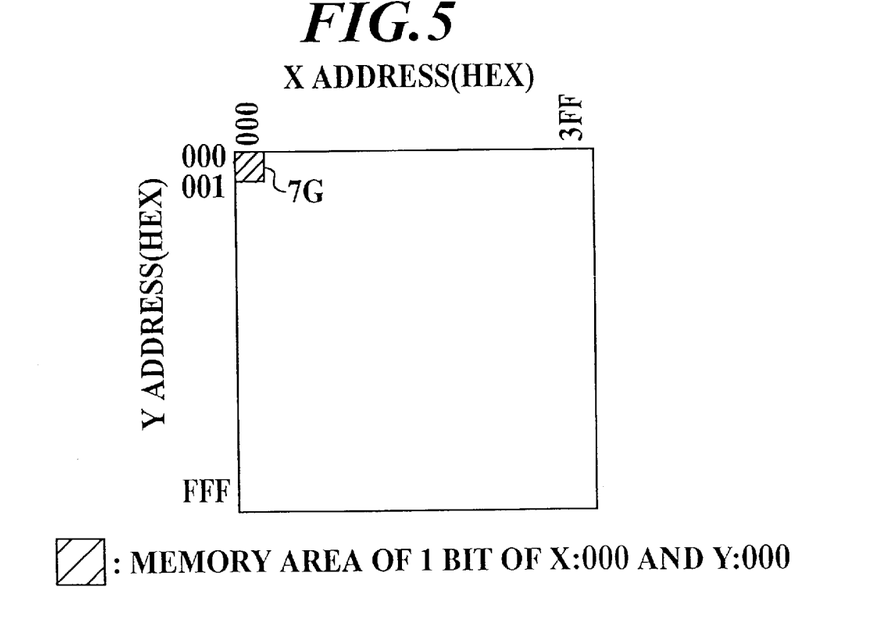
FIG. 5 is a view showing an example case that the failure data written to a plurality of addresses of the device to be measured is stored in one bit of the internal memory.

FIG. 5 is a view showing an example case that the failure data written to a plurality of addresses of the device 5 to be measured is stored in one bit of the internal memory 7D.

For example, when the device 5 to be measured uses the bits X0 to X11 as the X address and uses the bits Y0 to Y11 as the Y address, the address space of the device 5 to be measured is of 24 bits. Because the space of the memory address 71 of the internal memory 7D is of 22 bits, the failure data is stored in the internal memory 7D in this condition, so that the failure analysis device is required to write the failure data four times. In the failure analysis device of the present invention shown in FIG. 2, the selector circuit 7A does not select the address bits X0 and X1 of the X and Y addresses received from the pattern generator 3, and selects the address bits from the bit X2. Thereafter, as shown in FIG. 5, an OR data of the failure data stored in the X addresses 0, 1, 2 and 3 of the device 5 to be measured is stored in one bit 7G of the internal memory 7D. As a result, the failure data stored in four addresses of the device 5 to be measured can be stored in the bit 7G of the internal memory 7D.

That is, when the X and Y addresses received from the pattern generator 3 are not selected by the selector circuit 7A and the failure data written to the above-described X and Y addresses is converted into an OR data, the failure data is stored to one address of the internal memory 7D whether the logic value of the OR data is "0" or "1". This shows that when the space of the device address of the device 5 to be measured is larger than that of the memory address 71 of the internal memory 7D, the addresses received from the pattern generator 3 are compressed in order to store the failure data to the address of the internal memory 7D at one operation. As a result, it is possible that the general failure condition of the device 5 to be measured is grasped by one failure data writing operation.

What is claimed is:

1. A failure analysis device for an IC tester which is in a memory device measuring device for writing a write pattern to a memory device, for comparing the write pattern written to the memory device with a write pattern which is not written to the memory device every address, for detecting that the write pattern written to the memory device is not coincident with the write pattern which is not written to the memory device as a failure data of the memory device and for analyzing the failure data; comprising:

an internal memory for storing the failure data into a memory address to be assigned; and a selector for optionally selecting X and Y address which assigns the memory address outputted from a pattern generator and for connecting the X and Y address with the memory address of the internal memory, wherein the selector closes up bits of a device address, which are not used by the memory device, selects the X and Y address and connects the X and Y address with the memory address of the internal memory.

2. A failure analysis device for an IC tester as claimed in claim 1, wherein the selector selects the X and Y address so that the memory address of the internal memory may be consecutive when the X and Y addresses received from the pattern generator are not consecutive, and connects the X and Y address with the memory address of the internal memory.

3. A failure analysis device for an IC tester which is in a memory device measuring device for writing a write pattern to a memory device, for comparing the write pattern written to the memory device with a write pattern which is not written to the memory device every address, for detecting that the write pattern written to the memory device is not coincident with the write pattern which is not written to the memory device as a failure data of the memory device and for analyzing the failure data; comprising:

an internal memory for storing the failure data into a memory address to be assigned; and a selector for optionally selecting X and Y address which assigns the memory address outputted from a pattern generator and for connecting the X and Y address with the memory address of the internal memory, wherein when an address space of the memory device is larger than that of the internal memory, the selector selects the X and Y address received from the pattern generator after part of the X and Y addresses are removed, and connects the X and Y address with the memory address of the internal memory; and wherein an OR data of the failure data written to a plurality of addresses of the memory device is written to an optional bit of the internal memory.

4. A failure analysis device for an IC tester as claimed in claim 3, wherein the selector selects the X and Y address so that the memory address of the internal memory can be consecutive when the X and Y addresses received from the pattern generator are not consecutive, and connects the X and Y address with the memory address of the internal memory.

5. A memory device measuring device for an IC tester, for carrying out a failure analysis of a memory device; comprising:

a timing signal generating circuit for generating a clock signal and a strobe signal;

a pattern signal generating circuit for generating a write pattern, and X and Y address;

a driver for fetching the X and Y address received from the pattern signal generating circuit and the write pattern corresponding to the X and Y address on the basis of the clock signal received from the timing signal generating circuit, for selecting a device address of the memory device and for outputting a device write pattern corresponding to the X and Y address;

the memory device for storing the device write pattern in the device address selected by the driver, wherein the device write pattern is read out as a device readout pattern by a comparator;

the comparator for comparing the write pattern with the device readout pattern read out from the memory device every address on the basis of the strobe signal received from the timing generating circuit and for outputting a failure data when the write pattern is not coincident with the device readout pattern;

a selector for optionally selecting the X and Y address received from the pattern signal generating circuit and for connecting the X and Y address with a memory address of an internal memory; and the internal memory for storing the failure data received from the comparator to the memory address assigned by the selector, wherein the selector closes up bits of the device address which are not used by the memory device.

6. A memory device measuring device for an IC tester as claimed in claim 5, wherein the selector selects the X and Y address so that the memory address of the internal memory can be consecutive when the X and Y addresses received from the pattern signal generating circuit are not consecutive, and connects the X and Y address with the memory address of the internal memory.

7. A memory device measuring device for an IC tester as claimed in claim 5, wherein when an address space of the memory device is larger than that of the internal memory, the selector selects the X and Y address received from the pattern signal generating circuit after part of the X and Y addresses are removed, and connects the X and Y address with the memory address of the internal memory, and an OR data of the failure data written to a plurality of addresses of the memory device is written to an optional bit of the internal memory.

8. A failure analysis device for an IC tester, for analyzing a failure data received from a memory device; comprising:

a memory for storing the failure data; and a selector for optionally selecting an address to which the failure data is written, for connecting the selected address with a memory address of the memory and for outputting the failure data to the memory;

wherein the selector closes up bits of the device address which are not used by the memory device.

9. A failure analysis device for an IC tester as claimed in claim 8, wherein the selector selects the address so that the memory address of the memory can be consecutive when the addresses to which the failure data is written are not consecutive, and connects the selected address with the memory address of the memory.

10. A failure analysis device for an IC tester as claimed in claim 8, wherein when an address space of the memory device is larger than that of the memory, the selector selects the address after part of the addresses are removed, and connects the selected address with the memory address of the memory, and an OR data of the failure data written to a plurality of addresses of the memory device is written to an optional bit of the memory.

11. A memory device measuring device for an IC tester, for measuring a device for a failure; comprising:

a pattern generating circuit for generating an X address signal, a Y address signal and a write pattern signal;

a comparison circuit for comparing the write pattern signal with a device readout pattern which is generated by writing the write pattern signal to the device, and for outputting a failure data when the write pattern signal is not coincident with the device readout pattern;

a memory for storing the failure data; and a selector for optionally selecting an address assigned by the X address signal and the Y address signal, for connecting the selected address with a memory address of the memory and for outputting the failure data to the memory;

wherein the selector closes up bits of the device address which are not used by the memory device.

12. A memory device measuring device for an IC tester as claimed in claim 4, wherein the selector selects the address assigned by the X address signal and the Y address signal so that the memory address of the memory can be consecutive when the addresses received from the pattern signal generating circuit are not consecutive, and connects the selected address with the memory address of the memory.

13. A memory device measuring device for an IC tester as claimed in claim 11, wherein when an address space of the device is larger than that of the memory, the selector selects the address received from the pattern signal generating circuit after part of the addresses are removed, and connects the selected address with the memory address of the memory, and an OR data of the failure data written to a plurality of addresses of the device is written to an optional bit of the memory.

* * * * *